United States Patent [19]

Dennis et al.

[11] Patent Number: 4,904,956

[45] Date of Patent: Feb. 27, 1990

[54] LINEAR DIGITAL FREQUENCY SWEEP SYNTHESIZER

[75] Inventors: Charles L. Dennis, Richardson; Edgar A. Bowden, Arlington, both of Tex.

[73] Assignee: Mobil Oil Corporation, New York, N.Y.

[21] Appl. No.: 253,291

[22] Filed: Oct. 5, 1988

[51] Int. Cl.$^4$ .............................................. H03L 7/00
[52] U.S. Cl. ........................................... 331/4; 331/25
[58] Field of Search ..................... 331/1 A, 4, 18, 25

[56] References Cited

U.S. PATENT DOCUMENTS

| | | | |
|---|---|---|---|
| 4,328,567 | 5/1982 | Dodge | 367/32 |
| 4,336,511 | 6/1982 | Stromswold et al. | 331/4 X |
| 4,383,308 | 5/1983 | Caldwell | 367/31 |
| 4,450,540 | 5/1984 | Mallett | 367/41 |
| 4,649,525 | 3/1987 | Angona et al. | 367/31 |
| 4,718,046 | 1/1988 | Medlin | 367/31 |

Primary Examiner—Eugene R. LaRoche
Assistant Examiner—Robert J. Pascal
Attorney, Agent, or Firm—Alexander J. McKillop; Charles J. Speciale; George W. Hager, Jr.

[57] ABSTRACT

A linear digital frequency sweep synthesizer employs an up-down counter for producing a first signal having a plurality of pulses with time interval between pulses linearly increasing with time and a phase lock loop for producing a second signal having a plurality of pulses having a frequency sweep linearized to the linearly increasing time intervals of such first signal.

10 Claims, 3 Drawing Sheets

LINEAR DIGITAL FREQUENCY SWEEP SYNTHESIZER

BACKGROUND OF THE INVENTION

It has long been known to acoustically log open wellbores to determine the velocities of compressional ("P") waves, shear ("S") waves, and tube ("T") waves traveling through rock formations located in the wellbore region. Logging devices have been used for this purpose which normally comprise one or more sound sources (transmitters) and one or more receivers disposed at preselected distances from the sound source. One such borehole logging tool is described in U.S. Pat. No. 4,383,308 to R. L. Caldwell.

By timing the travel of compressional waves, shear waves and/or tube waves between the transmitter and each receiver, it is normally possible to determine the nature of surrounding rock formations. In logging loosely consolidated formations, however, it is often difficult to distinguish between compressional, shear, tube and secondary waves which may comprise portions of a wave train arriving at a given receiver. The use of remotely spaced, multiple receivers is thus intended to aid in distinguishing between arriving wave fronts and from noise in the system. Multiple receivers permit the recognition of similar wave patterns and wave fronts which are received at each successive receiver. Since travel time differences increase with increasing distance from the transmitter source, wave fronts and patterns which are closely spaced at proximate receiver locations will separate by the time of their receipt at remote receiver locations.

In the design of logging tools, various types of transmitters, such as piezoelectric or magnetostrictive transmitters, have been suggested for creating acoustic logging signals. For conventional logging operations, most such transmitters have been centrally located in the borehole and have been adapted to generate sound which is radiated in a multidirectional (360°) pattern from the transmitter to adjacent wellbore surfaces. Such transmitters are well suited for creating compressional waves in surrounding rock and sand formations.

Since compressional waves travel faster than those shear, tube or secondary waves which may also be produced by a multidirectional transmitter, calculation of compressional wave velocity is accomplished by presuming that the first arriving wave front or wave pattern is that of a compressional wave. In loosely consolidated formations, subsequent arrivals of shear waves, tube waves and/or secondary waves are difficult to distinguish. In such formations, multidirectional transmitters tend to generate compressional waves of much greater amplitudes than any shear waves also produced thereby. Recognition of shear wave arrivals is thus particularly difficult.

Recently, attention has been directed to developing transmitters which are particularly suited to a single point force application of acoustic energy to the borehole wall. The theory behind point force transmitters is that they produce an asymmetrical acoustic energy radiation pattern as contrasted with the multidirectional radiation pattern. One such point force transmitter is the bender-type disclosed in U.S. Pat. No. 4,649,525 to Angona and Zemanek. Use of such a bender-type transmitter is employed in the acoustic well logging tool of U.S. Pat. No. 4,718,046 to Medlin to generate such an asymmetrical acoustic energy radiation pattern. In such logging tool the unrestricted planar surfaces of the bender-type transmitter are oriented along the longitudinal axis of the tool and are exposed to a coupling liquid within the tool. Sine wave tone bursts excite the transmitter to generate asymmetric acoustic energy waves having a dominant mode of vibration. The frequency of the tone burst may be fixed or swept as the tool traverses the subsurface formations to produce the desired compressional, shear, or tube waves.

SUMMARY OF THE INVENTION

The present invention is directed to a method and apparatus for producing a piecewise linear-digital frequency sweep signal. Such signal is utilized by a sine wave generator to produce a frequency sweep sine wave tone burst suitable for exciting an acoustic-transmitter in a downhole logging operation. A first digital signal is produced having a plurality of pulses with time intervals linearly increasing with time. This first signal is converted to a second digital signal having a plurality of pulses with a frequency sweep linearized in time with such first digital signal. In a further aspect, such second digital signal is converted to a sine wave tone burst having a frequency sweep linearized to the frequency sweep of such second digital signal.

In a more specific aspect, a down counter produces a borrow pulse each time it counts down to zero. An up counter is incremented by the borrow pulse to load the down counter with a count sequentially increasing in number with each borrow pulse, such that each sequential count down cycle of the down counter is linearly increased in time and the time interval between borrow pulses is linearly increased with time. A reference clock signal is also provided. A phase detector compares the phase differences of the borrow pulses with the reference clock signal. An oscillator produces output pulses having a frequency determined by the difference in phase in the borrow pulses and the reference clock signal. These output pulses are applied as clock pulses to the down counter for incrementing the down counter to zero following each loading of the down counter by the up counter in response to the borrow pulses. In this manner the frequency sweep of the output pulses is linearized with time in accordance with the linearly increasing time interval between the borrow pulses caused by the linearly increasing time of each sequential count down cycle of the down counter.

DESCRIPTION OF THE PREFERRED EMBODIMENT

Figure 1:
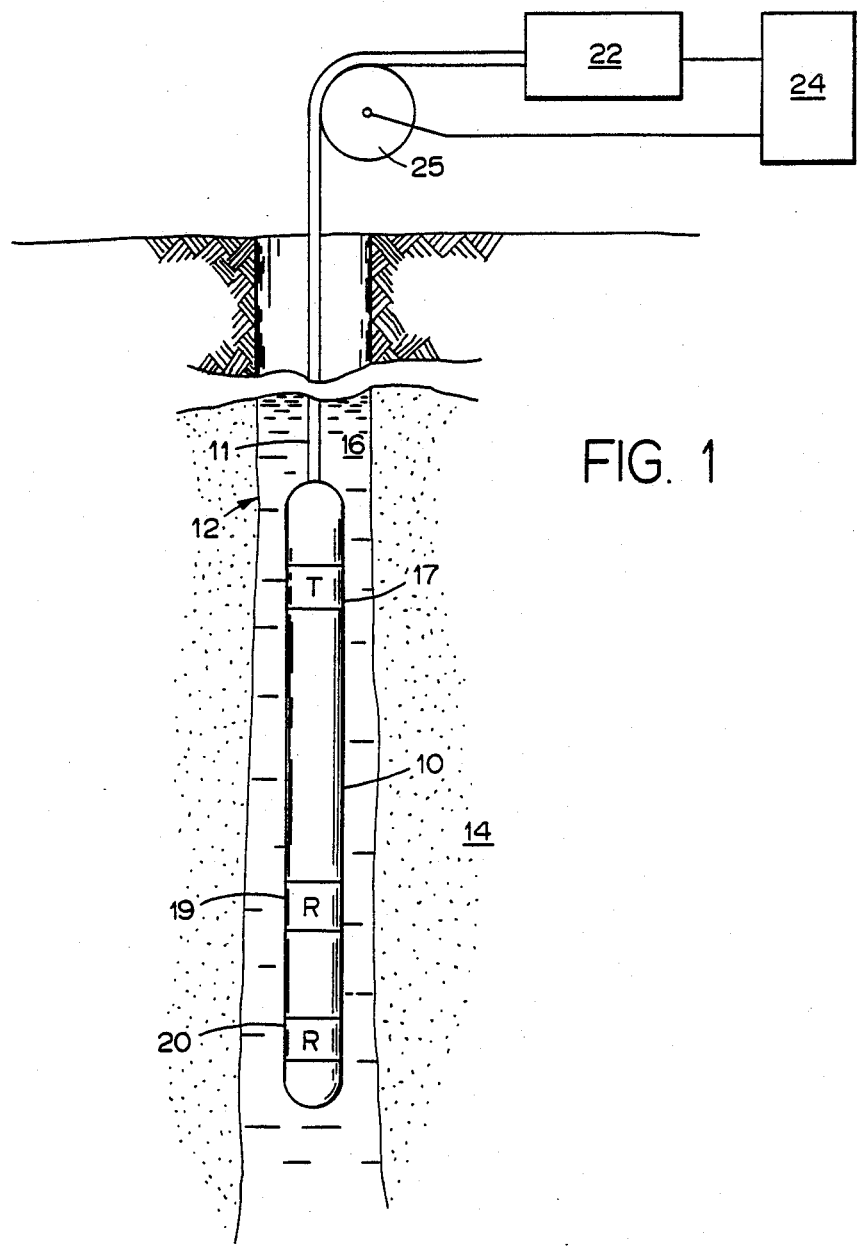
FIG. 1 illustrates a borehole logging tool with which the present invention may be utilized.

Referring now to FIG. 1, there will firstly be described a borehole acoustic velocity logging system with the frequency synthesizer of the present invention may be utilized. The logging system includes an elongated logging tool 10 which is suspended from a cable 11 within a borehole 12 which traverses a subterranean formation. The tool 10 includes the acoustic source or transmitter 17 for the production of repetitive time-spaced pulses of acoustic energy and a pair of spaced-apart receivers 19 and 20 for the detection of the generated acoustic pulses after their travel through the surrounding formations and for their conversion into representative electrical signals. These signals are transmitted uphole by the conductors in cable 11 to any suitable utilization system at the surface. For example, the utilization system is illustrated as comprising a control unit 22 to which the cable 11 is directed over the sheave 25. A recorder 24 is connected to the control unit 22 for recording, or displaying the data received from the downhole tool 10 in correlation with depth. In carrying out the borehole logging operation, the logging tool 10 is initially lowered to the vicinity of the bottom of the borehole 12 and the transmitter 17 is energized. Some of the generated acoustic energy may be received by the receivers 19 and 20 as compressional or shear waves by way of the formation adjacent the borehole 12, as tube waves by way of the borehole wall and as normal mode waves by way of the fluid within the borehole.

Typically the transmitter is energized by a sine wave tone burst from a surface tone burst generator that may be located in the control unit 22. This tone burst is a sine wave driving current with a duration of one or more cycles. Commercial devices are available for generating tone bursts, such as a Model 7060 Generator, supplied by Exact Electronics, Hillsboror, Oreg., with a Model MC 2500 Power Amplifier, supplied by McIntosh Laboratory, Binghamton, N.Y. Amplitudes are in the range of 100-150 volts RMS. This voltage is sufficient for generating acoustic source levels from the transmitter which will provide detectable acoustic signals in conventional long-spaced, bender-type receivers in borehole logging tools.

However, as noted in the aforementioned patent to Medlin, it may not be practical or efficient to utilize a fixed tone burst frequency when running a large suite of logs. A more practical method is to run a single log in which the transmitter is driven by a frequency sweep tone burst in which the frequency is varied so as to decrease linearly with time, preferably starting at about 10 kHz and terminating at about a few hundred Hz.

A problem encountered in driving a downhole bender-type transmitter with a frequency sweep tone burst generated within the control unit 22 or the surface of the earth is in the transmission of the tone burst along the length of the logging cable 11 as a low level driving signal to the bender-type transmitter 17. No matter how low a level the tone burst is, the thousands of feet of logging cable introduces cross feed problems, especially when the tone burst is a frequency sweep tone burst. It is therefore advantageous to generate such a frequency sweep tone burst within the logging tool 10.

One system for generating the frequency sweep tone burst within the logging tool after lowering the tool to the downhole location is shown in U.S. Pat. No. 4,450,540 to Mallett. Briefly, Mallett employs a sweep signal storage memory containing digital numbers representative of the amplitude of sweep pattern to be applied to a transmitter as a function of time at a preselected sampling interval time or rate. Such sweep function amplitudes are generated by computer as a function of time and stored in a read only memory (ROM). Digital signals from the ROM are read out sequentially, converted to analog signals by a digital to analog converter, filtered by a low pass filter, and applied to the transmitter.

It is a specific aspect of the present invention to provide for such a downhole generation of a frequency sweep tone burst by means of a new and improved digital frequency synthesizer having a degree of precision which has heretofore not been obtainable and which is needed for the driving of the bender-type transmitter during the logging of a subsurface formation.

Figure 2:
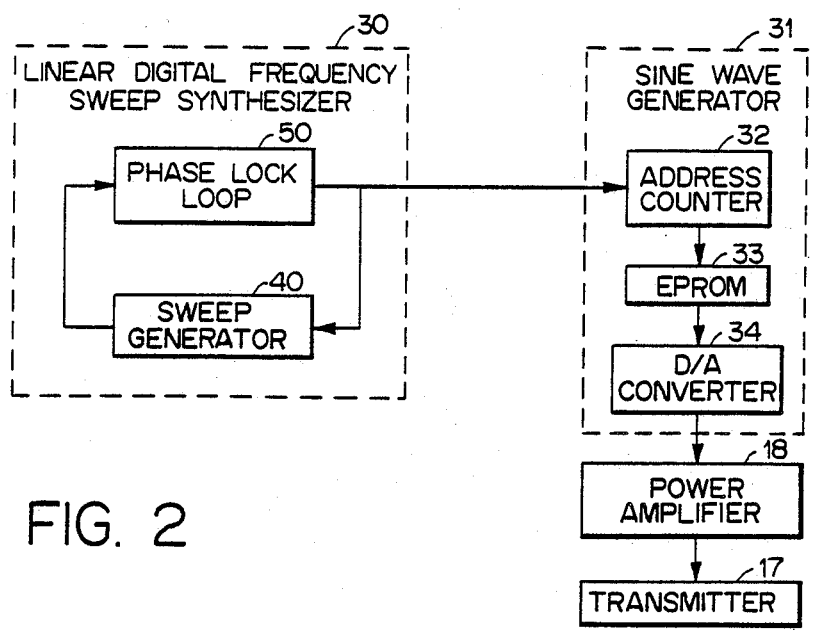
FIGS. 2 and 6 are electrical circuit diagrams of the linear digital frequency sweep synthesizer of the present invention.
Figure 3:
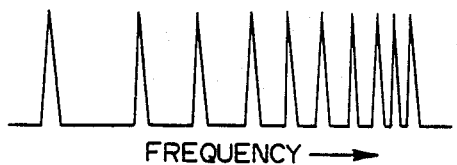
FIGS. 3-5 illustrate waveforms of electrical signals produced by the electrical circuits of FIGS. 2 and 6.

Referring now to FIG. 2 there is shown the linear digital frequency sweep synthesizer 30 of the present invention and the sine wave generator 31. The output of the sine wave generator 31 is the desired frequency sweep tone burst as shown in FIG. 3. Such linear sweep is represented by the following expression:

$$f = \mathrm{SIN}\, 2\pi[F+(\mathrm{RATE} \times t)]t \quad (1)$$

where
F = initial frequency (Hz),
RATE = rate of sweep increase (Hz/sec), and
t = time (sec).

Figure 4:
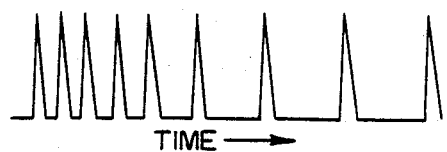

Referring again to FIG. 2, the linear digital frequency sweep synthesizer 30 generates precision pulses whose frequency increases linearly in time, i.e. frequency sweep pulses as shown in FIG. 4. The sine wave generator 31 utilizes these frequency sweep pulses to produce the desired sweep of sinusoidal waves of FIG. 3. Sine wave generator 31 consists of a six bit address counter 32, an electronically programmable read-only-memory (EPROM) 33, and a digital-to-analog (D/A) converter 34. The EPROM 33 is programmed as a sine function lookup table. It contains 64 values of the sine function (compatible with the six bit input address). The D/A converter 34 converts the EPROM digital sine waves back to an analog signal voltage. The EPROM 33 address is supplied from the address counter 32. In operation, the output from the sweep synthesizer 30 clocks the address counter 32, which cycles the EPROM 33 through all the sine values in the lookup table. The D/A converter 34 then converts the EPROM values to analog voltages, resulting in the desired frequency sweep sine wave tone burst of FIG. 3.

Having described the general operation of sine wave generator 31, detailed reference will now be made to the operation of the sweep synthesizer generator 30 is providing the desired degree of precision to the linear frequency sweep pulses of FIG. 4 for use by the address counter 32 in cycling the EPROM 33 through all the sine values in the lookup table. It is this precision sweep of digital pulses linearly increasing in frequency with time applied to a downhole sine wave generator that is the specific feature of the present invention.

Figure 6:
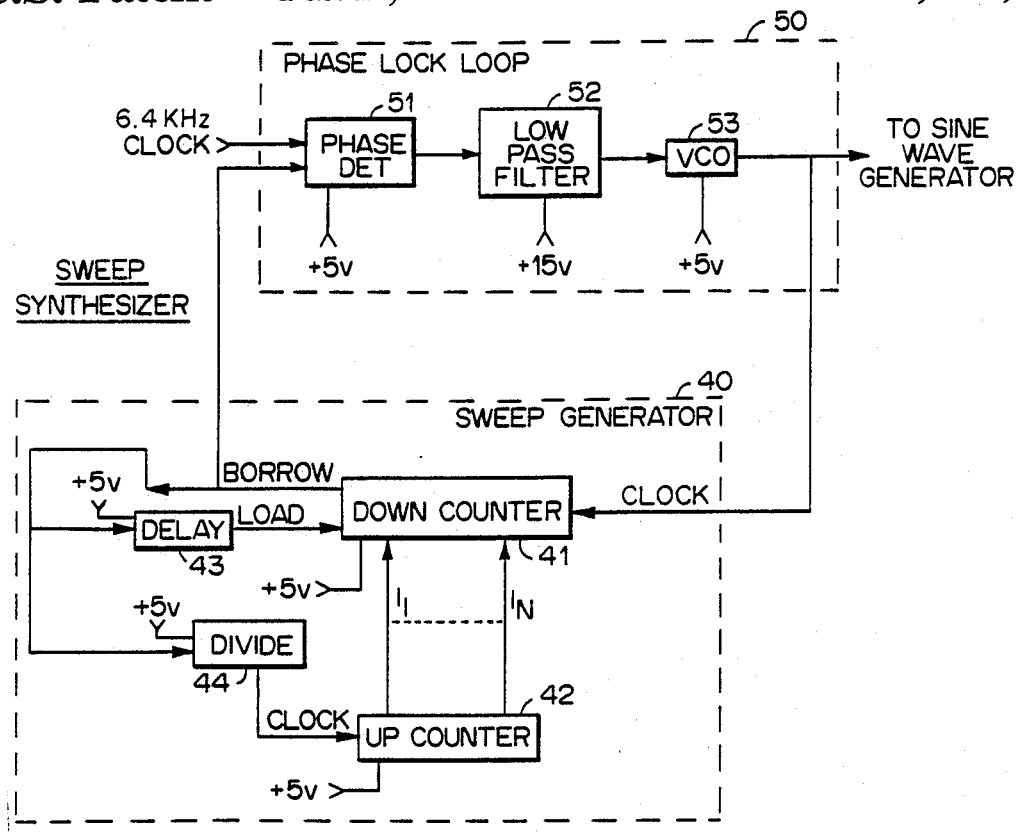

Referring now to FIG. 6, sweep synthesizer 30 comprises the sweep counter 40 and the phase lock loop 50. Sweep counter 40 employs a down counter 41 to produce a "borrow" signal each time it counts down to zero. This borrow signal is used by the up counter 42 to load the down counter 41 over lines $I_i$ to $I_n$ for the next count down. Thus, with a "0" initially in the up counter 41 and a "0" in the down counter 42, the first clock pulse to down counter 41 will produce a "borrow" signal to increment up counter 42 to a "1" and load this "1" into the down counter 41 over lines $I_i$ to $I_n$. The next count down cycle will take one full clock cycle to produce a "borrow" signal from the down counter, increment the up counter to "2" and load the down counter to "2". The next count down cycle will take two clocks, the following cycle will take three clocks, and so forth up to N clock periods when the total cycle repeats. Since the output of the sweep counter 40 to the phase lock loop 50 is taken from the same "barrow", this output will be a series of pulses with time intervals of 0, 1, 2, 3 . . . N. If the input clock is 1 MHz, for example, each interval will be a multiple of 1 microsecond. By way of further example, if the counters are each 4-bit counters, the lines $I_l$ to $I_n$ will load four parallel digital states of "0" or "1" into down counter 42. Thus N will sequentially increase from 0 to 16 counts per count down cycle. Accordingly, each successive count down cycle is one count or time interval longer than the preceding count or time interval.

In this manner, the time interval between output pulses from sweep counter 40 is linearly increasing with time. However, what is required by the sine wave generator 31 as an input is a frequency which is linearly increasing with time. Since frequency is the reciprocal of time, a phase lock loop 50 is employed as a linearizer to change the linearly increasing time signal from sweep generator 40 to a linearly increasing frequency signal. Phase lock loop 50 comprises phase detector 51, low pass filter 52 and voltage controlled oscillator (VCO) 53. A clock is input to the phase detector 51 where it is compared to the "borrow" signal from sweep generator 40 with respect to phase. The output of the phase detector 51 is filtered by low pass filter 52. The output of low pass filter 52 is applied to VCO 53. The output of VCO 53 is used to clock the sweep generator 40, thereby completing the loop. In this configuration the sweep generator 40 provides a divide-by-N function into the phase lock loop with N increasing linearly with time. Since the VCO 53 provides a frequency output that is a function of N due to the comparison in phase detector 51 of the "borrow" signal with the input clock, such frequency output will correspondingly increase linearly with time as shown in FIG. 4. In this manner the frequency output may be said to be locked to or linearized with the "borrow" signal. Consequently the linearly increasing time interval provided by sweep generator 40 is converted by phase lock loop 50 into a frequency sweep increasing linearly with time for utilization by the sine wave generator 31 in energizing the borehole logging tool transmitter 17 through power amplifier 18.

Also shown in FIG. 6 for the sweep generator 40 are the delay unit 43 and the divide unit 44. Delay unit 43 is a one-shot multivibrator which delays the loading of the down counter 41 by the up counter 42 until the up counter has been incremented. Divide unit 44 is a divide-by-64 counter. Without such unit 44 the sine wave tone burst would remain at a single frequency for only one clock period. It is important for the tone burst to remain at a single clock frequency for 64 clock periods, which is the modulo of the EPROM 33 in the sine wave generator 31. With the unit 44, the tone burst remains at each sine wave frequency for one full sinusoidal cycle of 64 clock periods.

Figure 5:
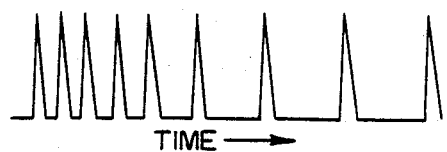

Having now completed a detailed description of the sweep generator 40 and phase lock loop 50 it can be understood that by inserting the sweep generator 40 into the loop of the phase lock loop 50 a linear digital frequency sweep synthesizer has been developed for driving the sine wave generator 31. The phase lock loop 50 by itself produces an output with frequency equal to N times its input frequency (Nfin). The sweep generator 40 by itself produces output pulses linearly increasing with time. By inserting sweep generator 40 into the phase lock loop of phase lock loop 50, the linearly increasing time signal from sweep generator 40 of FIG. 5 replaces the function of N in equation (2), thereby producing the linearly increasing frequency signal of FIG. 4 for driving sine wave generator 31 to produce the desired sine wave tone burst as represented by equation (1) above and as shown in FIG. 3.

While a particular embodiment of the present invention has been described and shown in FIGS. 2 and 6, it will be understood that the circuit components are merely representative of such particular embodiment and various other types and values of circuit components may be utilized without departing from the spirit and scope of the invention as set forth in the appended claims. In accordance with such particular embodiment, the following Table sets forth specific types and values of circuit elements.

| Address Counter 32 | HC 393 (RCA) |
|---|---|
| EPROM 33 | H 2716 (HARRIS) |
| D/A Converter 34 | UP8B (DATEL) |
| UP/DOWN Counters 41 & 42 | HC 193 (RCA) |
| Delay 43 | HC 123 (RCA) |
| Divide 44 | HC 393 (RCA) |
| Phase Detector 51 | CD 4046 (RCA) |
| Low Pass Filter 52 | CD 4046 (RCA) |
| VCO 53 | CD 4046 (RCA) |

We claim:
1. A method for producing a linear digital frequency sweep signal, comprising the steps of
   (a) producing a plurality of count down cycles linearly increasing with time,
   (b) producing a first signal having a plurality of pulses with time interval between pulses linearly increasing with time in response to said plurality of count down cycles,
   (c) determining phase differences between said first signal and a reference clock signal, and
   (d) producing a second signal having a plurality of pulses with a frequency sweep linearly increasing with time determined by said phase differences.

2. The method of claim 1 wherein the clock rate of each count down cycle is controlled by said second signal such that the frequency sweep of said second signal is linearized with the time sweep of said first signal.

3. Apparatus for providing a linear digital frequency sweep signal, comprising:
   (a) a first circuit having an up-down counter for producing a first signal having a plurality of pulses with time intervals between said pulses linearly increasing with time,
   (b) a reference clock signal,
   (c) a second circuit for comparing said first signal with said clock signal and producing a second signal having a plurality of pulses with frequency linearly increasing with time, and
   (d) means for applying said second signal as an input clock to said first circuit such that the rate of sweep of frequency with time of said second signal is locked to the rate of sweep of time intervals with time of said first signal.

4. An apparatus for providing a linear digital frequency sweep signal, comprising:
   (a) a down counter which produces a borrow pulse each time it counts down to zero,
   (b) an up counter which is incremented by said borrow pulse to load said down counter with a count sequentially increasing in number with each borrow pulse, such that each sequential count down cycle of said down counter is linearly increased in time and the time interval between borrow pulses is linearly increased with time, (c) a reference clock signal, (d) a phase detector for comparing the borrow pulses from said down counter with said reference clock signal, (e) an oscillator for producing output pulses having a frequency determined by the difference in phase in said borrow pulses and said reference clock signal, and (f) means for applying said output pulses as clock pulses to said down counter for incrementing said down counter to zero following each loading of said down counter by said up counter, in response to said borrow pulses, so that the frequency sweep of said output pulses is linearized with time in accordance with the linearly increasing time interval between said borrow pulses caused by the linearly increasing time of each sequential count down cycle of said down counter.

5. The apparatus of claim 4 further comprising a delay unit for delaying the loading of said down counter from said up counter following each borrow pulse so that said up counter can be incremented before its contents are loaded to said down counter.

6. The apparatus of claim 4 further comprising a divide unit for dividing the borrow signal by a number N prior to its being utilized in the incrementing of said up counter.

7. An acoustic borehole logging tool comprising:

(a) a sweep generator for producing a digital time sweep signal with intervals between pulses linearly increasing with time, (b) a phase lock loop for converting said digital time sweep signal to a digital frequency sweep signal with frequency increasing linearly with time, (c) a sine wave generator driven by said digital frequency sweep signal for producing a frequency sweep sine wave tone burst with frequency increasing linearly with time, (d) an acoustic transmitter energized by said frequency sweep sine wave tone burst for producing acoustic energy waves in the formations surrounding a borehole, and (e) a spaced-apart receiver for detecting said acoustic energy waves after they have traveled through a portion of the formation surrounding the borehole.

8. The acoustic borehole logging tool of claim 7 wherein said sweep generator comprises:

(a) a down counter which produces a borrow pulse each time said down counter counts down to zero, and (b) an up counter which is incremented by said borrow pulse to load said down counter with a count sequentially increasing in number with each borrow pulse, such that each sequential count down cycle of said down counter is linearly increased in time and the time interval between borrow pulses is linearly increased with time.

9. The acoustic borehole logging tool of claim 7 wherein (a) said sine wave generator includes a programmable read-only-memory having a sine function look-up table with N values of the sine function and a digital-to-analog converter for providing a sine wave frequency output that is a function of N, and (b) said sweep generator includes a divide-by-N counter so that said sine wave tone burst remains at each sine wave frequency for one full sinusoidal period of N clock periods.

10. The apparatus of claim 6 further comprising:

(a) a sine wave generator including a programmable read-only-memory with N values of a sine function, and (b) a digital-to-analog converter producing a frequency sweep sine wave tone burst that is a function of N, said divide unit incrementing said up counter so that each frequency sweep sine wave tone burst remains at each sine wave frequency of the tone burst for one full sinusoidal period of N clock periods.

* * * * *